United States Patent
Gotoh et al.

(10) Patent No.: US 6,282,781 B1
(45) Date of Patent: Sep. 4, 2001

(54) RESIN PACKAGE FABRICATION PROCESS

(75) Inventors: Masashi Gotoh; Jitsuo Kanazawa, both of Ibaraki; Syuichiro Yamamoto, Chiba, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/212,863

(22) Filed: Dec. 17, 1998

(30) Foreign Application Priority Data

Dec. 18, 1997 (JP) .................................................. 9-364537

(51) Int. Cl.[7] .................................................. H05K 3/32
(52) U.S. Cl. .................................. 29/841; 29/842; 29/848; 29/832; 29/739; 174/52.2; 174/52.4
(58) Field of Search ........................... 29/841, 842, 848, 29/740, 739, 832; 264/272.17; 174/52.2, 52.4

(56) References Cited

U.S. PATENT DOCUMENTS

| | | | |
|---|---|---|---|
| 4,745,215 | * 5/1988 | Cox et al. | 560/301 |
| 5,001,542 | 3/1991 | Tsukagoshi et al. | 357/68 |
| 5,161,304 | * 11/1992 | Queyssac et al. | 29/827 |
| 5,599,611 | * 2/1997 | Afzali-Ardakani et al. | 442/180 |
| 5,706,175 | * 1/1998 | Takei | 361/760 |
| 5,706,579 | * 1/1998 | Ross | 29/840 |
| 5,784,261 | * 7/1998 | Pedder | 361/767 |
| 5,849,230 | * 12/1998 | Murohara | 264/138 |
| 5,926,694 | * 7/1999 | Chigawa et al. | 438/106 |
| 5,960,536 | * 10/1999 | Ogino et al. | 29/841 |
| 5,969,461 | * 10/1999 | Anderson et al. | 310/313 R |
| 6,114,005 | * 9/2000 | Nagai et al. | 428/114 |
| 6,114,753 | * 9/2000 | Nagai et al. | 257/668 |

FOREIGN PATENT DOCUMENTS

| | | |
|---|---|---|
| 59-129445 | 7/1984 | (JP) . |
| 4-140194 | 5/1992 | (JP) . |
| 5-286074 | 11/1993 | (JP) . |
| 8-55867 | 2/1996 | (JP) . |
| 8-78566 | 3/1996 | (JP) . |
| 8-153953 | 6/1996 | (JP) . |
| 8-316374 | 11/1996 | (JP) . |

OTHER PUBLICATIONS

Journal of electronics manufacturing vol. 5, No. 4, Dec. 1995, p. 253–261.*

* cited by examiner

Primary Examiner—Carl J. Arbes
Assistant Examiner—Minh Trinh
(74) Attorney, Agent, or Firm—Oblon, Spivak, McClelland, Maier & Neustadt, P.C.

(57) ABSTRACT

A resin package fabrication processes comprises three steps. At the first step, a thermosetting resin-containing resin substrate is machined. At the second step carried out after the first step, the resin substrate is heated to an original glass transition temperature that the resin substrate has or a temperature that is higher than the glass transition temperature so that the glass transition temperature that the resin substrate has is elevated to a new glass transition temperature. At the third step, a resin layer is placed on at least a portion of the resin substrate to which the new glass transition temperature is imparted, and the resin substrate with the resin layer placed on that portion is then heated to the original glass transition temperature or a temperature between the original glass transition temperature and the new glass transition temperature, thereby fixing the resin layer to the resin substrate.

4 Claims, 7 Drawing Sheets

FIG. 3

AT STEP A, A RESIN SUBSTRATE IS MACHINED ($T_g = T_g1$).

↓

AT STEP B, THE MACHINED SUBSTRATE IS THERMALLY TREATED AT A HEATING TEMPERATURE $T_a \geq T_g1$, SO THAT $T_g = T_g2$ ($T_g2 > T_g1$).

↓

AT STEP C, ELECTRONIC PARTS ARE MOUNTED ON THE FIRST SUBSTRATE.

↓

AT STEP D, THE THERMALLY TREATED RESIN SUBSTRATE IS BONDED BY HEATING AT A HEATING TEMPERATURE $T_b$ ($T_g1 \leq T_b < T_g2$).

↓

AT STEP E, THE RESIN SUBSTRATE ASSEMBLY IS DICED INTO RESIN PACKAGES.

PRIOR ART FIG. 8
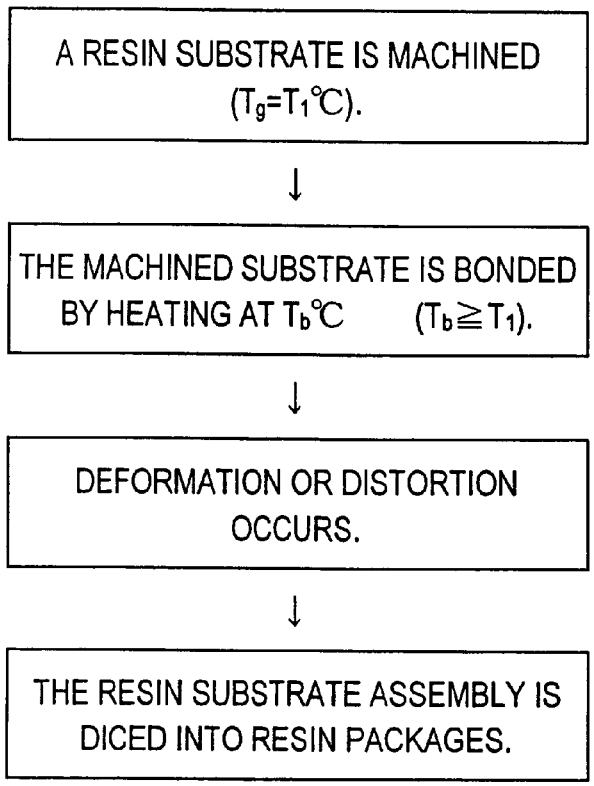
FIG. 9
PRIOR ART
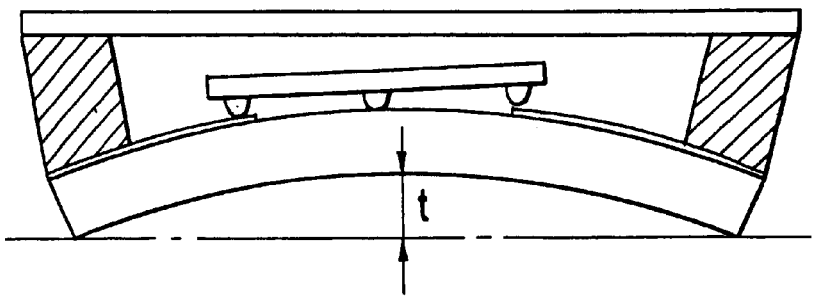

RESIN PACKAGE FABRICATION PROCESS

BACKGROUND OF THE INVENTION

The present invention relates to a process of fabricating a resin package used with electronic components, etc.

A resin package such as that of the chip-on-board structure wherein electronic components such as semiconductor chips are mounted on a resin substrate in a flip chip manner and the electronic components are then covered and sealed up with a resin layer such as a silicone resin layer, and a resin package of the pin grid array (PGA) or ball grid array (BGA) structure wherein multiple resin substrates are laminated and bonded together enables outer configurations, through-holes, and chip-mounting recesses to be formed by machining with drills, and rooters in an economical manner yet with high accuracy, because the resin substrates are rich in machinabililty. Instead of ceramic packages, these resin packages are now widely used as packages for ICs, sensors, surface acoustic wave devices, etc.

Basically, it is desired that resin packages can meet requirements inclusive of 1) miniaturization, 2) high accuracy compatible with high-density packaging, 3) compatibility with diverse configurations, and 4) high reliability. Especially for the achievement of ever higher-density packaging, there is now a growing demand for further miniaturization of resin packages. Thus, it is required to arrive at a tradeoff between high-precision micro-machining and high reliability.

Some prior art processes are explained with reference to FIGS. 7, and 8. FIG. 7 illustrates a process of fabricating a resin package using a resin substrate comprising a first resin substrate member on which chips are to be mounted, and a second resin substrate member that is to form a frame member. The second resin substrate 51 of about 0.5 mm in thickness is provided therein with rectangular windows 52a, through-holes 52b, etc. by means of machining with a drill or rooter. Then, the second resin substrate 51 is aligned with and placed on the first resin substrate 54 with a prepreg 53 of about 0.1 mm in thickness sandwiched between them (see FIG. 7(A)). The assembly is heated to about 200° C. under pressure to laminate and bond together the resin substrates while the prepreg remains fluidized (see FIG. 7(B)). In this case, the first resin substrate 54, too, has been drilled or otherwise machined. Following this, the thus laminated and bonded assembly is separated into sections as by dicing, as shown by broken lines (see FIG. 7(C)). After a chip is mounted in the rectangular window 52a, the window 52a is sealed up by a lid (not shown). If required, the first resin substrate 54 and/or the second resin substrate 51 are provided with conductor patterns. So far, resin packages with chips incorporated therein have been formed in this manner.

FIG. 8 illustrates a typical prior art resin package fabrication process sequence wherein resin substrates are laminated and bonded together. At the beginning, a conventional resin substrate formed of thermosetting resin such as BT resin has a relatively low glass transition temperature (Tg:Tg=$T_1$° C.), and generally possesses hardness and elasticity capable of machining because of including a high-molecular or polymer component having an unsaturated degree of polymerization. The resin substrate is cut, drilled or otherwise machined in this state. Such resin substrates upon machining are placed one upon another with a prepreg sandwiched between them, or a sealing agent, an adhesive agent or the like is potted on the resin substrates. Then, the resin substrates are heated to a temperature Tb (° C.) that is higher than the glass transition temperature of the aforesaid wiring board to laminate and bond or fix together them. After this, the bonded laminate is spontaneously cooled and diced into discrete sections. So far, the resin package has been fabricated in this way.

Since the bonding of laminated resin substrates such as BT substrates by heating is carried out at a temperaure that is greater than the glass transition temperature thereof, however, the prior art processes have such contradictory problems as explained below.

(1) A BT substrate that is one example of the resin substrate is easily machinable if the glass transition temperature (Tg) thereof is between 170° C. and 190° C. However, the BT resin, if it has a glass transition temperature (Tg) brought up to 200° C. or higher, becomes hard due to its increased degree of polymerization, with its machinability becoming worse. This BT resin then provides a resin substrate that is brittle and susceptible to cracking, chipping or peeling upon machining, and so cannot stand up well to high-accuracy machining. At the same time, tools such as blades of drills or rooters wear away excessively, resulting in a drastic decrease in the number of the holes to be formed.

(2) When the glass transition temperature (Tg) that resin substrates have from the beginning is lowered, on the other hand, the temperature to which the resin substrates are heated at post-steps for their lamination and bonding is much higher than the initial glass transition temperature (Tg). Consequently, there is an increase in the degree of polymerization of the resin substrates at the heating temperature applied at the post-steps. This increase is then associated with pressurization during heating to give rise to thermal deformation of the resin substrates such as warpage, and shrinkage, as shown in FIG. 7(C) and the process sequence of FIG. 8. As a result, difficulty is involved in dicing the laminated assembly into discrete resin packages. Moreover, a problem arises when chip components are mounted in a resin package cavity in a flip chip bonding manner, as can be seen from FIG. 9 that is a sectional schematic showing deformation of a prior art resin package. That is, the heights of bumps between the chip components vary and, hence, a portion of insufficient bonding strength occurs. This portion may in turn cause failures such as bump displacements, resulting in a lowering of the reliability of resin package products. To make electrical connections between a largely deformed package and chips, means having a large degree of dimensional freedom, e.g., wire bonding must be selected, and package size increases, accordingly. In other words, miniaturization is not achievable.

(3) If a prepreg is heated at a temperature that is lower than the glass transition temperature (Tg), its thermal deformation at post-steps may then be avoided. However, insufficient bonding strength makes it impossible to bring resin substrates in close contact with each other, resulting in a lowering of sealing performance and, hence, a lowering of the airtight reliability of resin packages. When a resin package is fabricated by laminating and bonding together resin substrates with a prepreg sandwiched between them, it is required to heat the prepreg to at least 200° C. exceeding the aforesaid glass transition temperature (Tg), thereby enhancing the fluidity of the prepreg to prevent voids from remaining therein, and increasing the bonding strength of the prepreg with respect to the resin substrates.

Generally speaking, the aforesaid prior art processes fails to gain the purpose of providing a resin package that can be micromachined with high precision, and is excellent in reliability as well.

In this connection, for instance, JP-A 8-316374 shows a BGA package of the structure wherein one side thereof is molded with a sealing material composed mainly of resin, and discloses that the sealing molding with a sealing resin composition is carried out at a temperature that is lower than the glass transition temperature (Tg) of the cured resin composition. The publication alleges that the amount of warpage of the BGA package can be reduced. To take full advantage of such effect, however, the type of resin in the resin composition, and the type of curing agent used should be properly selected. Thus, not only are there many material constraints but also the resultant product becomes poor in heat-resistant reliability because the selected resin has a low curing temperature.

One object of the invention is to provide a solution to the aforesaid problems by the provision of a process of fabricating a resin package of excellent reliability while taking advantage of the excellent machinability that a resin substrate possesses. Another object of the invention is to provide a resin package fabrication process having high efficiency in addition to the advantages as mentioned just above. Yet another object of the invention is to provide a resin package fabrication process that enables a package to be miniaturized.

SUMMARY OF THE INVENTION

The aforesaid objects are achieved by the inventions defined below as (1) to (4).

(1) A resin package fabrication process comprising a first step of machining a resin substrate containing a thermosetting resin, a second step carried out after said first step, wherein said resin substrate is heated to an original glass transition temperature that said resin substrate has or a temperature higher than said glass transition temperature so that said glass transition temperature that said resin substrate has is elevated to a new glass transition temperature, and a third step of placing a resin layer on at least a portion of said resin substrate to which said new glass transition temperature is imparted, and heating said resin substrate with said resin layer placed on said portion to said original glass transition temperature or a temperature between said original glass transition temperature and said new glass transition temperature, thereby fixing said resin layer to said resin substrate. According to this process, deformation of the resin substrate can be reduced as much as possible and so the package can have high reliability.

(2) The resin package fabrication process according to (1), wherein said third step is carried out after electronic components are mounted on said resin substrate upon heating at said second step, and at said third step said resin layer is placed on at least a portion of said resin substrate with said electronic components mounted thereon, and said resin substrate with said resin layer placed thereon is then heated to a temperature between said original glass transition temperature and said new glass transition temperature, thereby fixing said resin layer to said resin substrate. According to this process, the packaging operation can be simplified because the deformation of the resin substrate remains reduced as much as possible by the process defined at (1).

(3) The resin package fabrication process according to (2), wherein said third step is carried out using a lid member, and said lid member is bonded to said resin substrate by said heating so that said electronic components mounted on said resin substrate are sealed up. According to this process, the heat-sealing operation can be curtailed and simplified.

(4) The resin package fabrication process according to (3), wherein said resin substrate comprises a first resin substrate which has a lid member and on which electronic components are mounted by means of a bump, and a second resin substrate acting as a lid member that covers said first resin substrate to form a cavity in which said electronic parts are contained, and a resin layer between said first resin substrate and said second resin substrate is heated to seal up said electronic components. According to this process, the package can be miniaturized.

As already mentioned, JP-A 8-316374 discloses that sealing molding with a sealing resin composition is carried out at a temperature that is lower than the glass transition temperature (Tg) of the cured resin composition. However, this publication is quite silent about the alteration by heating of the glass transition temperature in the machining operation of the resin substrate that is a resin package material and the glass transition temperature of the resin substrate at the sealing stage, as referred to herein.

BRIEF DESCRIPTION OF THE DRAWINGS

The aforesaid and other objects, features, and advantages of the invention will be better understood from the following description taken in conjunction with the accompanying drawings.

FIG. 3 illustrates a resin package fabrication process sequence according to the invention.

FIG. 8 is a process sequence showing a typical prior art resin package fabrication process.

FIG. 9 is a sectional view of an example of deformation of a prior art resin package.

DETAILED DESCRIPTION OF THE INVENTION

Figure 1:
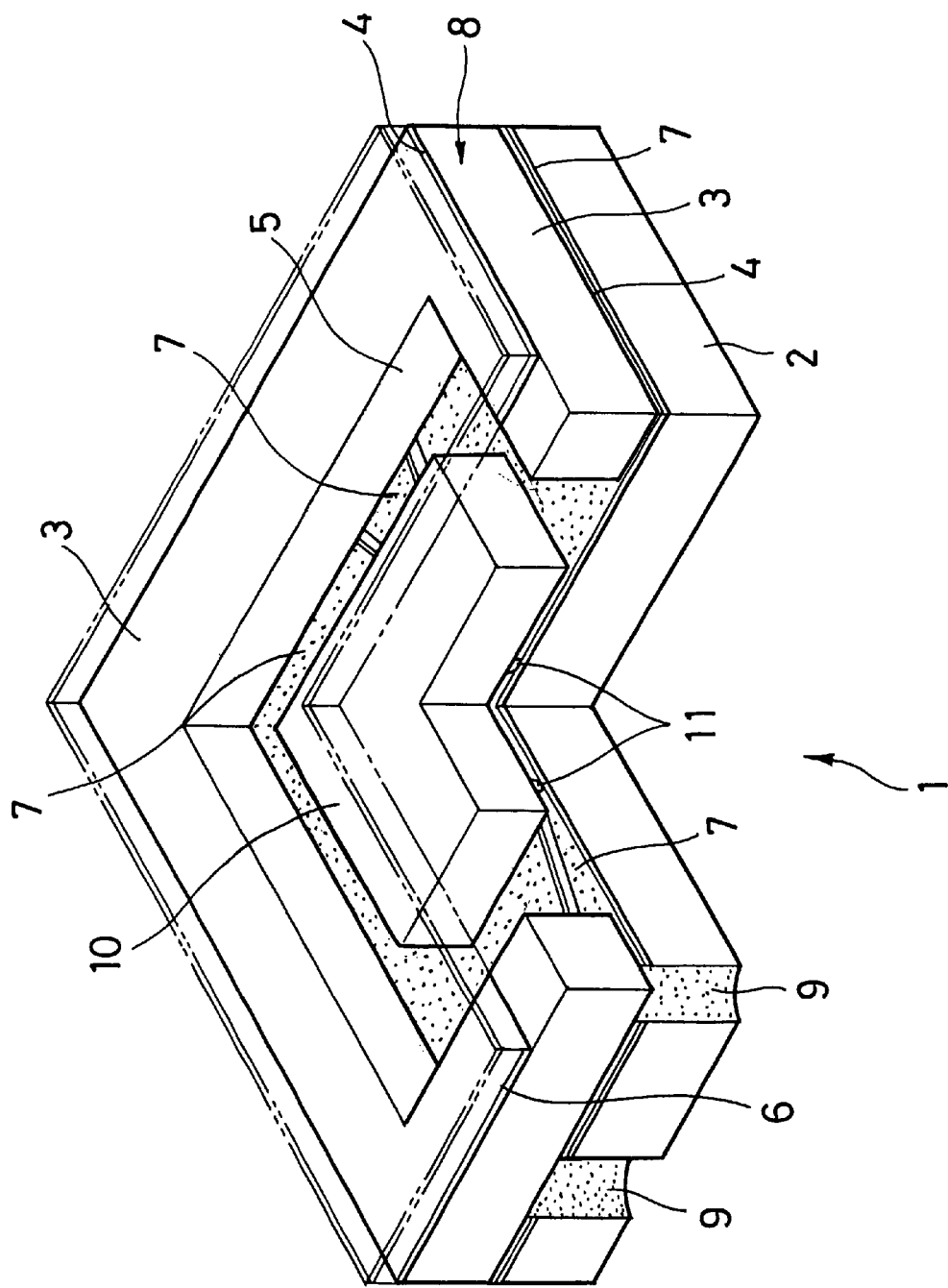
FIG. 1 is a perspective view of one structure of a resin package to which the invention is applied.

The present invention will now be explained in further detail.

According to the invention, a thermosetting resin-containing resin substrate for resin packages (e.g., a glass fiber-reinforced substrate, resin molded substrate, and composite substrate) is first machined. Then, the resin substrate is thermally treated at a glass transition temperature Tg1 that the resin substrate has from the beginning or at a temperature Ta that is higher than Tg1, thereby bringing the glass transition temperature of the resin substrate up to Tg2. Following this, a resin layer (sealing resin or prepreg) is placed on the resin substrate on which electronic components are mounted, if required. Additional resin substrates serving as a frame and a lid are placed on the resin substrate, if required. Then, these resin substrates are heated at Tg1 or at a temperature between Tg1 and Tg2 so that the resin layer is fixed thereto. Finally, the assembly is separated by proper dicing or other means into discrete resin packages or resin sealed electronic components.

At the first step of the invention, the resin substrate can be easily machined because it is still placed in a soft state containing a polymer having a low glass transition temperature. When a resin molded substrate, for instance, is drilled in a direction in which difficulty is involved in drilling by molding or provided with through-holes at a narrow pitch, which can hardly be formed by molding, it is required that drilling be performed at a later step. If the resin substrate is drilled in a state where the glass transition temperature is still kept low upon molding, however, the wearing away of the drill or rooter used can be reduced because of ease of drilling.

After the resin substrate has been machined, it is thermally treated at the second step so that the glass transition temperature can be brought up to the new glass transition temperature Tg2. At the third step, the resin substrate with the resin layer placed thereon is heated at a temperature that is lower than the new glass transition temperature Tg2, so that the resin layer can be bonded to the resin substrate. At this bonding stage, no deformation of the resin substrate occurs. More specifically, the process of the invention can well prevent any thermal deformation of the substrate, and any warpage of the substrate under the influences of shrinkage stress, etc., which have often been found in the prior art. According to the invention, it is thus possible to eliminate failures found in the prior art, for instance, breaks in junctions between components mounted on a resin substrate, and poor packaging in the case of large resin packages, which is caused by warpage of an individual resin package with nothing mounted thereon, resulting in a floating of terminals during soldering. Moreover, an assembly of a number of resin packages comprising laminated and bonded resin substrates can be cut into discrete resin packages with high dimensional accuracy during dicing, because of no warpage, and no deformation.

Unless the resin substrate is subjected to the predetermined thermal treatment to elevate the glass transition temperature, the resin substrate is then deformed at the resin substrate bonding stage, resulting in yield reductions. At the bonding stage, if the resin substrate is heated at a temperature that is lower than Tg1, poor bonding then occurs, and if the resin substrate is heated at a temperature that is higher than Tg2, it is then deformed. Moreover, if the resin substrate already subjected to the predetermined thermal treatment is machined, its machiability then becomes worse.

Thus, the process of the invention is characterized in that, by carrying out the thermal treatment at the predetermined temperature, the glass transition temperature of the resin substrate is brought up to a temperature that is higher than the glass transition temperature of the resin substrate during molding, and is higher than the bonding temperature applied. Such a glass transition temperature change is believed to have close relations to the degree of polymerization or crosslinking of the thermosetting resin contained in the resin substrate. Stated otherwise, during molding there is a polymer component having an unsaturated degree of polymerization or crosslinking. It is believed that the polymerization or crosslinking of this polymer component is accelerated by the thermal treatment at the predetermined temperature. In numerical parlance, this means that although varying with the type of polymer, the degree of polymerization is about 2 to 10% higher after the thermal treatment than during molding; the degree of polymerization reaches at least 95% after the thermal treatment and, in some cases, gains a value approximate to about 100%. The degree of polymerization in this case is estimated from the number of functional groups in the thermosetting resin contained in the resin substrate, the skeleton of the resin, the glass transition temperatures of the resin during molding and after the thermal treatment, and so on.

It is here to be noted that the glass transition temperature of the resin substrate increases with the degree of crosslinking, and that once the resin substrate has have an increased glass transition temperature, it continues to maintain such a high glass transition temperature even after cooled back to room temperature. This is true of the degree of polymerization; the resin substrate, once thermally treated, continues to keep the degree of polymerization high even after cooled back to room temperature.

The present invention is explained with reference to the accompanying drawings.

FIG. 1 is a perspective view of one embodiment of the resin package structure to which the invention is applied.

One resin package generally shown at 1 in FIG. 1 is diced out of a multilayered assembly comprising a plurality of laminated and bonded resin substrates. A first resin substrate 2 is a substrate having a given thickness and containing a thermosetting resin therein. The cut and separated resin substrate 2 is provided in its end face with through-holes 9, from which a conductor pattern 8 extends. A resin frame 3 is a frame obtained by machining a frame resin substrate with a rooter, and formed of the same material as used to form the first resin substrate 2 having a given thickness. At a later step, the resin frame 3 will be laminated on the first resin substrate 2 to form a cavity in a middle portion of the resin package 1. The resin frame 3 is laminated on and bonded to the first resin substrate 2 with a prepreg 4 sandwiched between them, said prepreg 4 having a given thickness. Laminated on and bonded to the resin frame 3 is a lid resin substrate 6 with a second prepreg 4 sandwiched between them, said prepreg 4 having a given thickness. The resin substrate 6 forms a lid member 8 (a second resin substrate) for the resin package together with the resin frame 3. It is here to be noted that the lid resin substrate 6 is a resin substrate formed of the same material as used to form the first resin substrate 2 and having a given thickness. By means of face down bonding, a chip (electronic components) 10 is mounted via bumps 11 in a hollow area 5 formed by the first resin substrate 2 and lid member (second resin substrate) 8.

Preferably, the first resin substrate 2 and lid member (second resin substrate) 8, each containing a thermosetting resin, are formed of the same material. In the first place, BT substrates are preferable for such resin substrates. It is here to be understood that the BT substrate is a generic name for resin substrates obtained using a highly heat-resistant, addition polymerization type of thermosetting resin (hereinafter the BT resin for short) composed mainly of a triazine resin component and further containing a polyfunctional maleimide compound and/or other denaturing compound. For instance, use may be made of a glass fiber-reinforced substrate CCL-HL-830 (Mitsubishi Gas Chemical Company, Inc.) wherein an epoxy resin is mixed with the BT resin to improve adhesion, PCT (pressure cooker test) resistance, heat resistance, and electrical properties and obtain a glass transition temperature of 190° C. (as measured by thermomechanical analysis (TMA) as mentioned in the catalogue).

For use, the aforesaid glass fiber-reinforced substrate may have further contained as the thermosetting resin a derivative of bisphenol A epoxy including a benzene skeleton; epoxy such as bisphenol F epoxy, o-cresol-novolak, phenol-novolak type epoxy, and their derivatives; and at least one selected from bismaleimide, and triazine resin and its derivative.

For the resin substrate according to the invention, not only the aforesaid glass fiber-reinforced substrates but also resin molded substrates and composite substrates may be used.

Preferably, the content of the thermosetting resin in the resin substrate is 10% by weight or greater.

The resin substrate may have a thickness selected depending on purpose, application, etc. When an SAW filter or the like is mounted on the back side of the resin package, however, it is preferred that the first resin substrate has a thickness of about 0.1 to 1 mm, the frame resin substrate has a thickness of about 0.35 to 1 mm, and the lid resin substrate has a thickness of about 0.1 to 0.5 mm.

For the prepreg sandwiched between the resin substrates, a selection may be made from any desired prepregs depending on resin substrate materials. Preferably in this invention, a BT resin, e.g., GHPL-830NF (Mitsubishi Gas Chemical Company, Inc.) that can cure at 200° C. within 2 hours is used in combination with the BT substrate. Preferably, such a prepreg can cure at the glass transition temperature Tg1 of the resin substrate before the thermal treatment or at a temperature between Tg1 and the glass transition temperature Tg2 of the resin substrate after the thermal treatment. The prepreg has a thickness of the order of 60 to 100 μm.

Figure 2:
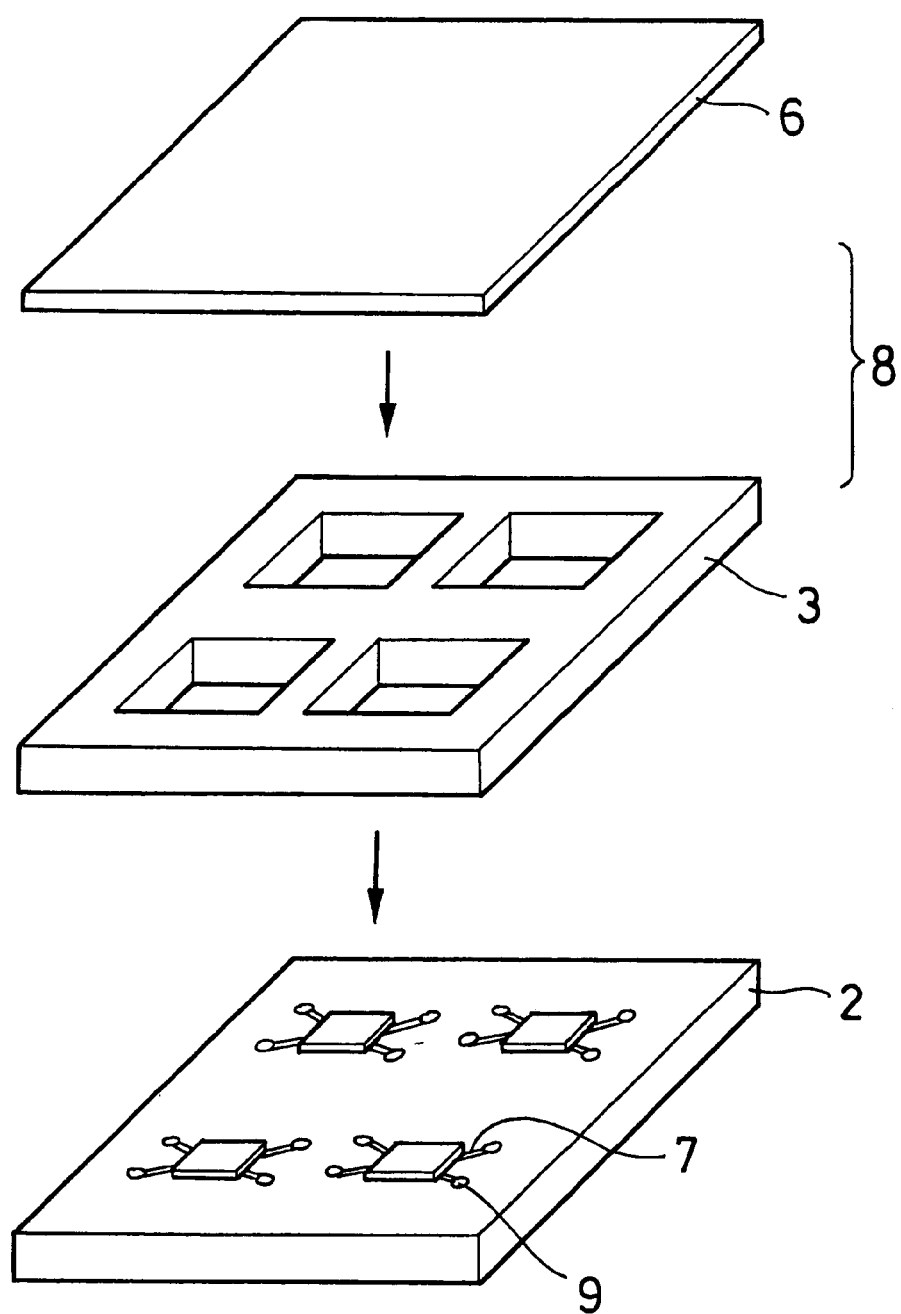
FIG. 2 illustrates a process sequence of how to fabricate a resin package according to the invention.

The process of fabricating the resin package of the invention shown in FIG. 1 is illustrated in FIG. 2, and one process sequence thereof is illustrated in FIG. 3. The first resin substrate 2, and the second resin substrate (frame resin substrate 3 and lid resin substrate 6) 8 have the same glass transition temperature (° C.; the first glass transition temperature) at the beginning. The first resin substrate 2 is provided with holes by means of machining such as drilling, and rooting. The lid resin substrate 6 is provided with through-holes 9, and a conductor pattern 7 as is the case with the first resin substrate 2, although not illustrated. The frame resin substrate 3, too, is provided with a rectangular window. The foregoing are Step A. Following this, the first resin substrate 2, and the lid and frame resin substrates 3, 6 are thermally treated at the first glass transition temperature Tg1 or at a temperature Ta (° C.) that is higher than Tg1 (Step B), whereby the resin substrates 2, 3, and 6 are each modified into a resin substrate having a second glass transition temperature Tg2 (° C.) that is higher than the first glass transition temperature Tg1. Thereafter, electronic components are mounted on the first resin substrate 2 by means of face down bonding (Step C). Subsequently, the frame and lid resin substrates 3 and 6 that form a lid member are aligned with and laminated on the first resin substrate 2 with the electronic components (chip) mounted thereon. While prepregs (not shown) are sandwiched between the resin substrates, heating is carried out at a temperature Tb (° C.) that is higher than the first glass transition temperature Tg1, and is lower than the second glass transition temperature Tg2 so that the resin substrates 3 and 6 are laminated on and bonded to the first resin substrate (Step D). Finally, the multilayered assembly is diced or otherwise cut into discrete resin packages (Step E).

In this case, the resin substrates 2, 3, and 6 are thermally treated with no load applied thereon. Preferably, they are thermally treated at a temperature that is higher than the first glass transition temperature Tg1 by about 0 to 30° C. Usually, the thermal treatment time is 0.5 to 3 hours although varying with the resin material, the thermal treatment temperature, etc.

Preferably, the second glass transition temperatures Tg2 of the resin substrates 2, 3, and 6 after the thermal treatment are higher than Tg1 by about 1 to 40° C., specifically about 5 to 30° C., and more specifically about 15 to 30° C.

Usually, the resin substrates 2, 3, and 6 are laminated and bonded together by heating under a given pressure (10 to 60 kg/cm$^2$). The heating is then carried out at the temperature Tb that is higher than Tg1 but lower than Tg2. However, it is preferable that the heating temperature Tb is equal to the thermal treatment temperature Ta. Preferably, the heating period of time is of the order of 0.5 to 3 hours. While the present invention has been described with reference to the lamination of the resin substrates as shown, it is understood that the present invention is not limited thereto. For instance, the present invention may also be applied to a process wherein the glass transition temperature of a resin substrate with through-holes formed thereon by machining is elevated, a chip is mounted on the resin substrate, a silicone or epoxy resin is potted on the resin substrate to cover the mounted chip and its periphery therewith while the upper side of the chip is not covered with another resin substrate, and the coating resin is cured by heating. According to this process, the potted coating resin cannot peel off the resin substrate because neither warpage nor deformation of the resin substrate occurs upon the curing of the potting resin by heating. This is also true of the structure where the potting strength of the silicone or epoxy resin to the resin substrate is relatively weak.

Furthermore, the present invention may be applied to a process wherein a lid member having an integrally combined frame and lid is bonded by heating to a resin substrate with a chip mounted thereon via a prepreg.

Preferably but not exclusively, bumps are used to mount electronic components on the resin substrate.

EXAMPLE

The present invention will now be explained more specifically with reference to examples. Example 1 A resin package as shown in FIG. 1 was prepared according to a process sequence as shown in FIGS. 2, and 3.

A BT substrate was used as the resin substrate. The BT substrate used herein was a glass fiber-reinforced substrate, CCL-HL-830 (Mitsubishi Gas Chemical Company, Inc.), which was found to have a glass transition temperature Tg1 of 187° C. as measured by TMA prior to thermal treatment, i.e., upon molding. GHPL-830NF (Mitsubishi Chemical Industries, Ltd.) BT resin curable at 200° C. within 2 hours was used as the prepreg.

BT substrates, each of 0.5 mm in thickness, 75 mm in length and 75 mm in width, were used as the first resin substrate and frame resin substrate, and a BT substrate of 0.2 mm in thickness, 75 mm in length and 75 mm in width was used as the lid resin substrate. A prepreg of 60 μm in thickness, 75 mm in length and 75 mm in width was used.

The BT substrate was machined as desired, and then thermally treated at 200° C. for 2 hours. The resin substrate was found to have a glass transition temperature Tg2 of 215° C. as measured by TMA after the thermal treatment. Prepreg bonding was carried out at 200° C. for 2 hours under a pressure of about 40 kg/cm$^2$.

Finally, dicing was carried out to obtain a chip-mounted resin package of 3.8 mm in length, 3.8 mm in width and 1.3 mm in height. The bumps used for chip mounting had a height of 20 μm.

One hundred such resin packages were investigated about how many defectives were included therein. Poor bonding due to poor prepreg bonding, and poor packaging due to deformation of the substrate were not found; no defective was quite observed. The BT substrate having a low glass transition temperature Tg before the thermal treatment could be machined with ease; machining gave no defective. Poor packaging due to deformation of the substrate was evaluated on the following criterion. Referring to FIG. 9, the amount of warpage of a substrate is shown at t. When the value of t is about 7 μm, poor packaging such as bump displacements occurs as shown in FIG. 9. It is when the value of t is about 2 μm or smaller that such poor packaging does not occur. Actually, the resin packages obtained as mentioned above were all found to have an amount of warpage, t, of at most 2 μm.

Resin packages were prepared as in the aforesaid process of the invention with the exception that BT substrates were not thermally treated, and investigated about how many defectives were included therein. Such poor packaging due to deformation of the substrates as shown in FIG. 9 was observed. In this case, 50% of the resin packages was defectives, each having an amount of warpage, t, of about 7 μm; the yield of resin package was considerably low.

Resin packages were prepared as in the process of the invention with the exception that the heating conditions for prepreg bonding were 180° C. and 3 hours. Noticeable poor bonding was observed.

Resin packages were prepared as in the process of the invention with the exception that the heating conditions for prepreg bonding were 230° C. and 1 hour. Poor packaging due to deformation of the substrates was observed.

In the process of the invention, resin substrates were thermally treated to elevate their glass transition temperatures, and then machined. As a consequence, it was found that machinability drops greatly.

From the foregoing, it is found that by using the fabrication process of the invention, it is possible to arrive at a sensible tradeoff between machinability and yield.

For a choice of the thermal treatment conditions according to the invention, the relationships between the thermal treatment conditions for BT substrates and the changes in their properties were investigated as explained below.

Amount of Warpage, Tg

BT substrates (of 75 mm in length, 75 mm in width and 0.5 mm in thickness) were thermally treated at 180° C., 190° C., and 200° C. for one hour, two hours, and three hours, respectively. Then, changes in the amount of warpage, and Tg of the substrates were examined. The results are plotted in FIGS. 4 and 5.

The amount of warpage (corresponding to t in FIG. 9) of substrates was determined by a surface roughness meter (Talystep-1, Taylor Hobson) when the substrates were heated under pressure under the prepreg bonding conditions of 200° C. and 2 hours. Tg was determined by TMA.

Figure 4:
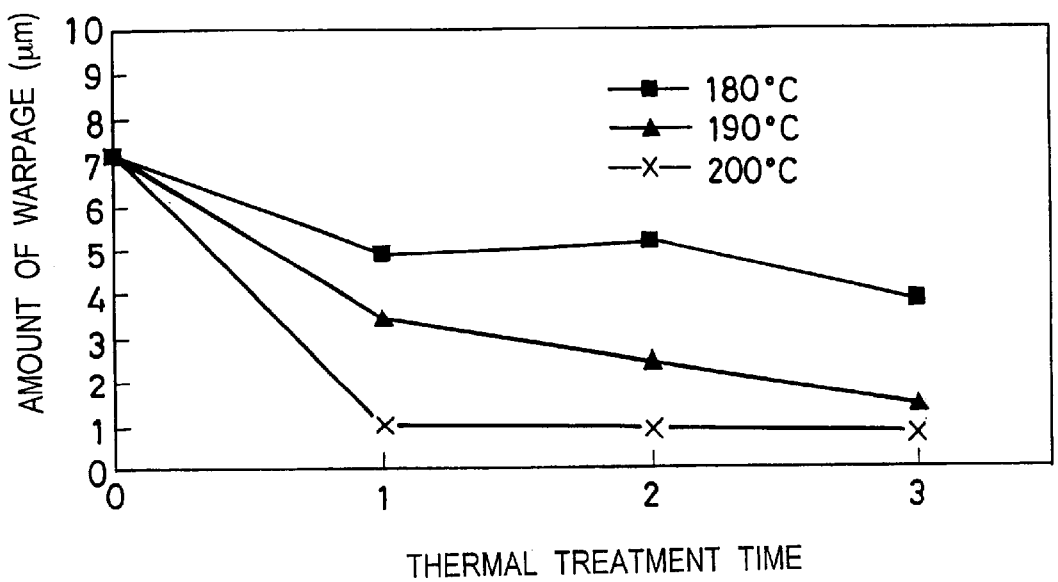
FIG. 4 is a graph showing changes in the amount of warpage of a resin substrate depending on thermal treatment conditions.

From FIG. 4, it is understood that the amount of warpage of the BT substrates before the thermal treatment was about 7 $\mu$m, and so are not suitable for use as resin packages. It is under the thermal treatment conditions of 200° C. plus 1 to 3 hours, and 190° C. plus 3 hours that the amount of warpage of about 2 $\mu$m or less is obtained. In other words, such thermal treatment conditions should be selected in the practice of the invention.

Figure 5:
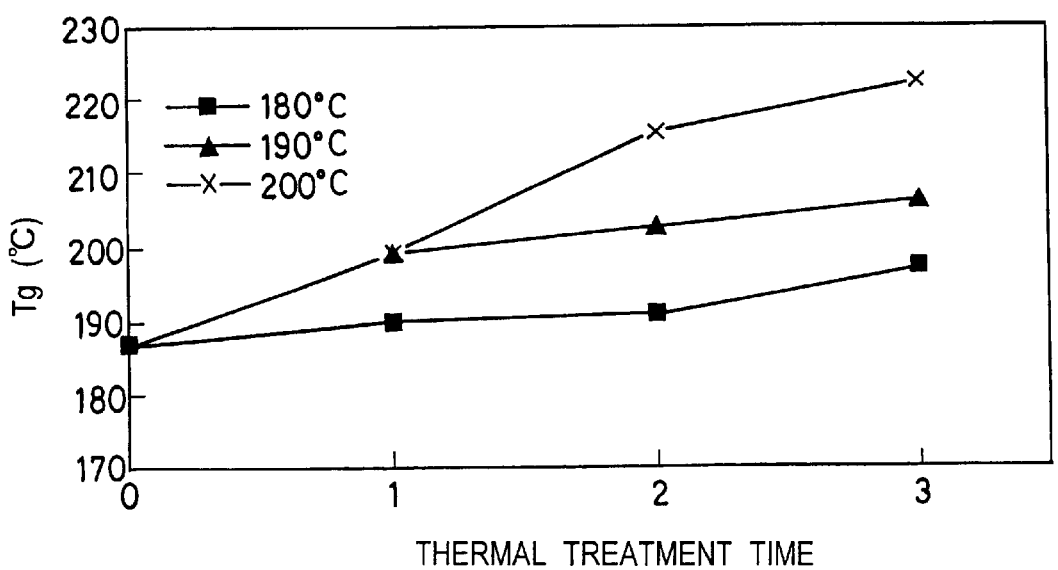
FIG. 5 is a graph showing changes in the glass transition temperature of a resin substrate depending on thermal treatment conditions.

From FIG. 5, on the other hand, it is understood that the glass transition temperature Tg that exceeds 187° C. is achievable by a 1 to 3-hour thermal treatment at 190° C., and 200° C. that are temperatures higher than the glass transition temperature Tg of the BT substrates before the thermal treatment. In view of the prepreg bonding conditions, however, it is preferable that the thermal treatment is performed at 200° C. for 2 to 3 hours.

From the results plotted in FIGS. 4, and 5 it is understood that although Tg changes to 215° C. upon the 2-hour thermal treatment at 200° C., yet the amount of warpage is less susceptible to variation, or stable, in such a Tg range. It is also found that when Tg is around 200° C., the amount of warpage varies largely.

Degree of Polymerization

The degree of polymerization of a BT substrate before the thermal treatment was estimated to be 90% from the number of functional groups in the resin, the skeleton of the resin, the Tg of the substrate, etc., and the degrees of polymerization upon heated for 2 hours at 160° C., 180° C., 200° C., and 220° C. were estimated from the values of Tg. This relationship is plotted in FIG. 6.

Figure 6:
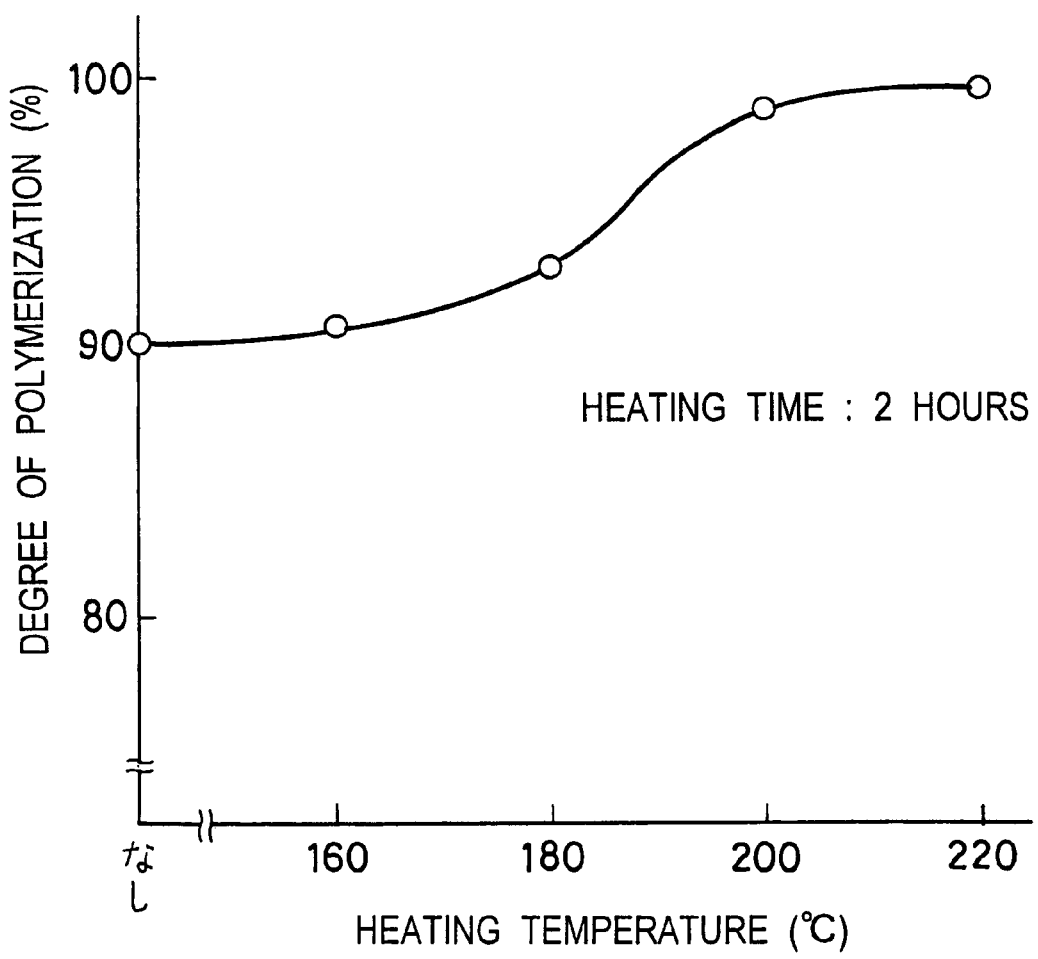
FIG. 6 is a graph showing a relationship between thermal treatment conditions and the degree of polymerization of a resin substrate.
Figure 7A:
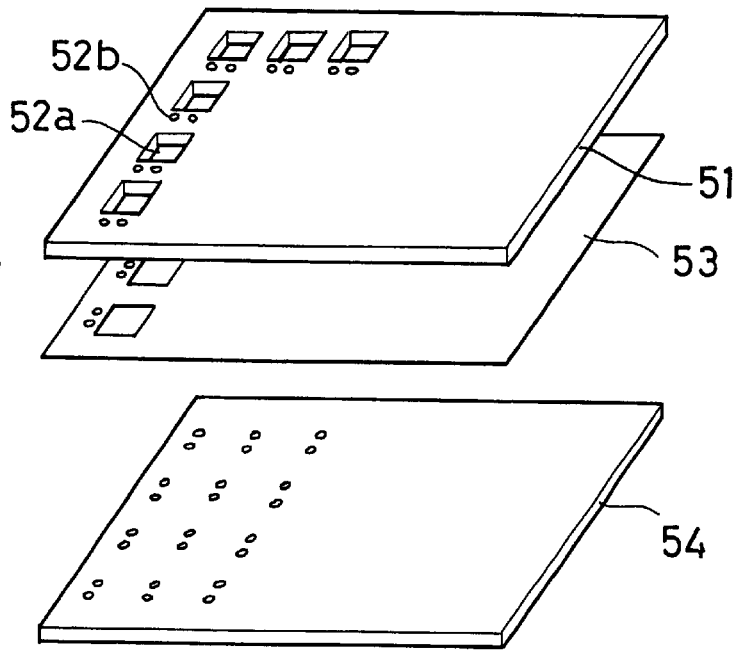
FIG. 7 illustrates a prior art resin package fabrication process using resin substrates.
Figure 7B:
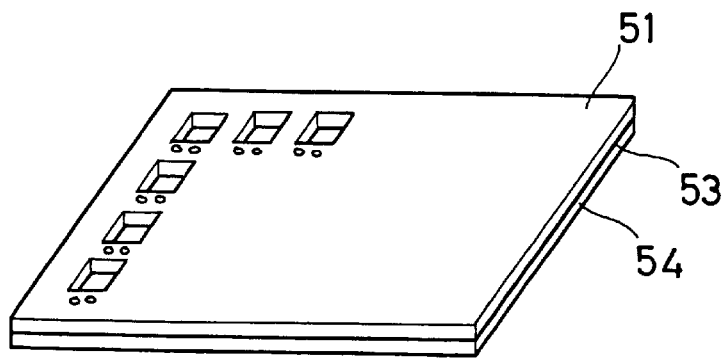
Figure 7C:
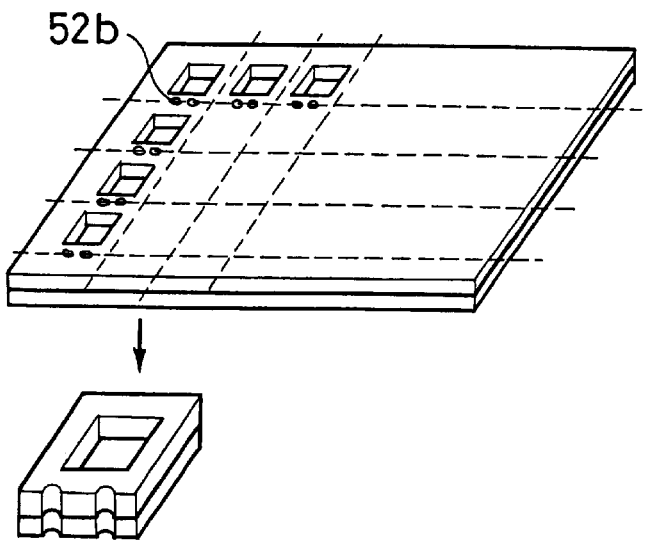

From FIG. 6 it is found that the degree of polymerization can be brought up to about 87% by a 2-hour heating at 200° C. It is thus found that the degree of polymerization is varied by the thermal treatment.

According to the invention, it is possible to provide a resin package using a resin substrate, in which the resin substrate can be machined with high accuracy and which has high reliability due to little or no deformation of the resin substrate by heating. This is because the resin substrate is machined, then thermally treated to bring the glass transition temperature that the resin substrate has at the beginning up to a new glass transition temperature or to modify the resin substrate to a resin substrate having a new glass transition temperature, and finally heated at a temperature that is lower than the new glass transition temperature to fix a resin layer thereto.

Japanese Patent Application No. 364537/1987 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What we claim is:

1. A resin package fabrication process, comprising:

machining a resin substrate comprising a thermosetting resin to provide a machined substrate;

a first heating of said machined substrate to a first temperature equal to or greater than an original glass transition temperature of said resin substrate, thereby providing said resin substrate with a second glass transition temperature higher than said original glass transition temperature;

placing a resin layer on at least a portion of said resin substrate having said second glass transition temperature; and a second heating of said resin substrate having said resin layer on at least a portion thereof to a second temperature, wherein said second temperature is equal to said original glass transition temperature or between said original glass transition temperature and said second glass transition temperature, to thereby fix said resin layer to said resin substrate.

2. The resin package fabrication process according to claim 1, further comprising:

mounting one or more electronic components on said resin substrate upon said first heating, wherein said step of placing a resin layer is performed such that said resin layer is placed on at least a portion of said resin substrate having said one or more electronic components mounted thereon.

3. The resin package fabrication process according to claim 2, wherein said step of placing a resin layer on said resin substrate is carried out using a lid member, wherein said lid member is bonded to said resin substrate by said second heating such that said one or more electronic components are sealed up.

4. The resin package fabrication process according to claim 3, wherein said resin substrate comprises a first resin substrate on which one or more electronic components are mounted by means of a bump, and a second resin substrate acting as a lid member for said first resin substrate and covering said first resin substrate to form a cavity in which said one or more electronic components are contained, and wherein said resin layer is between said first resin substrate and said second resin substrate, such that upon said second heating step, said one or more electronic components are sealed up by said resin layer.

* * * * *